United States Patent
Fukui et al.

(10) Patent No.: US 6,927,084 B2
(45) Date of Patent: Aug. 9, 2005

(54) METHOD OF MANUFACTURING ACTUATOR AND INK JET HEAD

(75) Inventors: Tetsuro Fukui, Kanagawa (JP); Takanori Matsuda, Kanagawa (JP); Toshihiro Ifuku, Kanagawa (JP); Akio Ikesue, Aichi (JP)

(73) Assignee: Canon Kabushiki Kaisha, Tokyo (JP)

( * ) Notice: Subject to any disclaimer, the term of this patent is extended or adjusted under 35 U.S.C. 154(b) by 175 days.

(21) Appl. No.: 10/412,395

(22) Filed: Apr. 14, 2003

(65) Prior Publication Data

US 2003/0196745 A1 Oct. 23, 2003

(30) Foreign Application Priority Data

Apr. 18, 2002 (JP) ........................................ 2002-116052

(51) Int. Cl.⁷ .............................................. H01L 21/00
(52) U.S. Cl. ........................................ 438/21; 427/100
(58) Field of Search ........................... 438/21, 455–459; 427/100

(56) References Cited

U.S. PATENT DOCUMENTS

| | | |
|---|---|---|
| 2002/0076875 | 6/2002 | Wasa et al. |
| 2002/0140320 | 10/2002 | Unno et al. |
| 2003/0003695 | 1/2003 | Unno et al. |
| 2003/0170381 * | 9/2003 | Kashiwaya ................. 427/100 |

FOREIGN PATENT DOCUMENTS

| | | |
|---|---|---|
| JP | 62-213399 | 9/1987 |
| JP | 11-348285 | 12/1999 |
| JP | 2001-113712 | 4/2001 |

* cited by examiner

Primary Examiner—Richard A. Booth
(74) Attorney, Agent, or Firm—Fitzpatrick, Cella, Harper & Scinto

(57) ABSTRACT

A method of manufacturing an actuator comprises the steps of bonding a piezoelectric film formed on a single crystal substrate to a diaphragm structure member and removing the single crystal substrate therefrom to manufacture the actuator. The single crystal substrate is a substrate having bonded portions where a plurality of single crystal substrates are bonded together.

7 Claims, 4 Drawing Sheets

METHOD OF MANUFACTURING ACTUATOR AND INK JET HEAD

BACKGROUND OF THE INVENTION

1. Field of the Invention

The present invention relates to a manufacturing method of an actuator and an ink jet head comprising the steps of bonding a piezoelectric film formed on a single crystal substrate to a diaphragm structure member and removing the single crystal substrate therefrom to manufacture the actuator and ink jet head. Particularly, the present invention relates to a manufacturing method useful for forming the actuator and ink jet head with a large area. Also, the manufacturing method can produce actuators and ink jet heads with large areas.

For example, the method can be suitably employed for manufacturing a piezoelectric/electrostrictive film type element, such as an ink jet print head, microphone, an articulator (loud speaker, etc.), various oscillators and radiators, as well as a piezoelectric/electrostrictive film type element which generates bending displacement of unimorph or bimorph type used for sensors, etc. Besides, so-called "element" herein means an element for transducing electric energy into mechanical energy, that is to say, mechanical displacement, stress, or oscillation, as well as an element for transducing reversely.

2. Description of the Related Art

Recently, in the field of optics or precision processing, a displacing element for adjusting optical path or location in the order of submicron and a sensing element for detecting microscopic displacement as an electric change have been desired, and as the answers for that being promoted is the development of piezoelectric/electrostrictive elements such as actuators, sensors composed of such elements that utilize displacement due to reverse voltage effect or electrostriction effect generated when applying an electric field to a ferroelectric piezoelectric/electrostrictive material, and the reverse phenomena.

Now, in an ink jet head, etc., a conventionally known unimorph or bimorph type structure is suitably employed as one of such a piezoelectric/electrostrictive element. In that field, print quality, print speed, etc. of a printer employing such an element has been required to be enhanced, and in order to respond that requirement the development for achieving miniaturization, densification, low voltage driving, high speed response, long multi-nozzle of such a piezoelectric/electrostrictive film type element is still being proceeded.

Moreover, in such a unimorph or bimorph type piezoelectric/electrostrictive element, although reduction in thickness of a substrate composing a diaphragm is considered to be important in order to obtain large bending displacement, generating force, or generation voltage, there remains yet a problem that decrease in strength or deterioration in smoothness occurs because of reduction in the thickness of such a substrate. Besides, there is still another problem in the conventional unimorph or bimorph type piezoelectric/electrostrictive element that reliability is deteriorated due to employment of an adhesive.

In order to overcome these problems, disclosed is in JP 62-213399 A a technology for providing rigid bond strength by means of sintering a piece of piezoelectric ceramics and a ceramic diaphragm together at the same time as a piezoelectric speaker. In this technology, however there have been still problems that optimum designing cannot be achieved by limitation of selecting diaphragm material due to high temperature sintering dissimilar materials and that alignment by precise dimensional tolerance of the order of micron over a large area is difficult due to shrinkage of the diaphragm and the piece of piezoelectric ceramics themselves. Thereby, it was difficult to obtain a highly reliable large area piezoelectric/electrostrictive element (actuator) or an ink jet head.

Further, in JP 11-348285 A, as a method of obtaining an ink jet head by forming a single crystalline piezoelectric film in order to obtain a higher density head, described is a method of utilizing a $Pb(Zr, Ti)O_3$ single crystal film formed on a $PbTiO_3$ single crystal as the ink jet head, and density of a diaphragm fabricated on the piezoelectric film was so poor as to be difficult to obtain a durable head. Further, in JP 2001-113712 A described is a method of manufacturing a long ink jet head using a plurality of MgO single crystal substrates. However, through this method it was difficult to manufacture a higher density head with regard to the gaps between the substrates generated when positioning the substrates. Further, since a large area MgO single crystal substrate cannot be stably manufactured, it was difficult to utilize a single crystalline or unidirectional crystalline piezoelectric film formed on the single crystal substrate for a large area actuator and ink jet head.

SUMMARY OF THE INVENTION

An object of the present invention is to provide a new manufacturing method suitable for a piezoelectric/electrostrictive element for which the above problems has been solved, specifically for an actuator or an ink jet head. Particularly, it is to provide a method of manufacturing a long, large area actuator and ink jet head utilizing a piezoelectric single crystal film or a unidirectional polycrystalline film. As a method of manufacturing the long, large area actuator and ink jet head generally employed is such a method that after directly forming a piezoelectric film on a diaphragm structure body a device is fabricated by processing and molding, however there is a case where a piezoelectric film with desired properties cannot be formed with regard to the lattice constant and the thermal expansion coefficient of the diaphragm structure body. The present invention is a manufacturing method by which the above problems have also been solved and can be applied to a long large area device composed of a piezoelectric film with desired properties.

The object of the present invention is to solve the above problems and also to provide an actuator and an ink jet head having a large area and narrow dethroughtions of properties according to a method of the present invention. It can suitably be used for a microphone, an articulator (speaker, etc.), various oscillators and radiators, an acceleration sensor, a pressure sensor, an oscillation sensor, an angular velocity sensor, etc.

A method of manufacturing an actuator of the present invention comprises the steps of bonding a piezoelectric film formed on a single crystal substrate to a diaphragm structure member, and removing the single crystal substrate therefrom to manufacture the actuator, wherein the single crystal substrate is a substrate having bonded portions where a plurality of single crystal substrates are bonded together. The single crystal substrate having width of bonded portions less than or equal to 3 μm can be employed. A surface roughness Ra of the single crystal substrate measured through the bonded portions may be less than or equal to 15 nm. The single crystal substrate preferably has 2 peaks of a rocking curve measured in XRD (X-ray diffraction) measurement, the locations of which are 0.05° to 2.0° different, more preferably 0.05° to 0.3°, apart from each other. The single crystal substrate may be one of an MgO substrate, an STO substrate, a $BaTiO_3$ substrate and a $ZrO_2$ substrate which may be doped with Y or a rare earth element. Thickness of the single crystal substrate can be 0.05 mm to 2.5 mm.

A method of manufacturing an ink jet head of the present invention comprises the steps of bonding a piezoelectric film formed on a single crystal substrate to a diaphragm structure member and removing the single crystal substrate therefrom to manufacture the ink jet head, wherein the single crystal substrate is a substrate having bonded portions where a plurality of single crystal substrates are bonded together.

The manufacturing method of the present invention has an effect that a long, highly dense piezoelectric actuator and ink jet head with excellent properties can be produced. Further, the manufacturing method of present invention has another effect that a piezoelectric film with excellent piezoelectric properties can be selected by means of a single crystal substrate and a device with large dimensions can also be processed.

DETAILED DESCRIPTION OF THE PREFERRED EMBODIMENTS

A manufacturing method of the present invention comprises the step of bonding a piezoelectric film formed on a single crystal substrate consisting of a plurality of bonded layers to a diaphragm structure body and the step of removing the single crystal substrate therefrom. The manufacturing method of the present invention comprises a step of forming the piezoelectric film on the single crystal substrate, a step of bonding the piezoelectric film to the diaphragm structure member, and a step of removing the substrate therefrom.

Figure 1A:
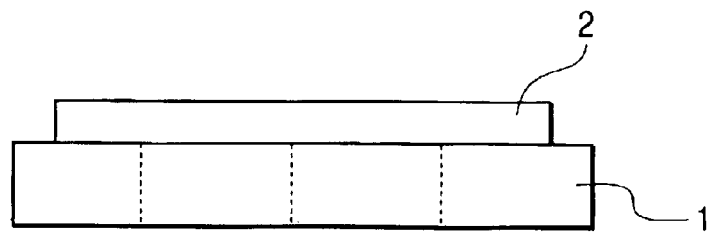
FIGS. 1A, 1B, 1C and 1D are schematic diagrams showing a manufacturing process of the present invention.
Figure 1B:
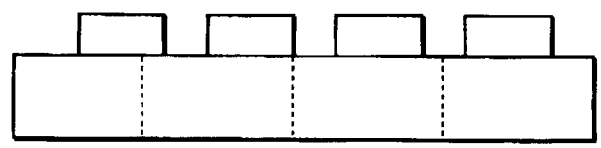
Figure 1C:
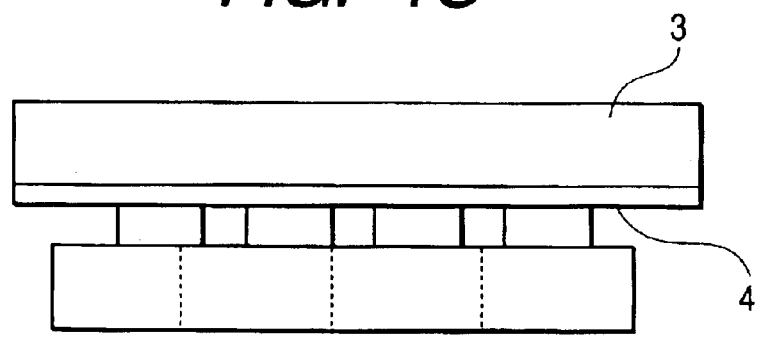
Figure 1D:

FIGS. 1A to 1D are schematic diagrams showing a manufacturing process of the present invention. FIG. 1A shows a state where a piezoelectric film 2 is formed on a substrate 1. FIG. 1B shows a state where a piezoelectric film is patterned after requirements for a device. The step is not essential, but a preferable embodiment for making an ink jet head device. FIG. 1C shows a state where the patterned piezoelectric film is bonded to a diaphragm structure member 3. The reference numeral 4 refers to a bond layer made mainly of metallic material. FIG. 1D shows a state where the substrate is removed after bonding.

The substrate 1 for use in the present invention is a single crystal substrate such as, for example, an MgO substrate, an STO($SrTiO_3$) substrate, a $BaTiO_3$ substrate, or a $ZrO_2$ substrate which may be doped with Y or a rare earth element. Examples of the rare earth element include Pr, Nd, Eu, Tb, Dy, Ho, Yb, Sm, Gd, Er and La. A preferable crystal face is (100), (111) or (101). A preferable substrate is the MgO substrate, the STO substrate, the $BaTiO_3$ substrate, or the doped $ZrO_2$ substrate. Further, the substrate for use in the present invention is such that plural substrates are bonded together. Therefore, in a rocking curve measured by XRD measurement, one or more peaks a few degrees apart from the main peak will be observed.

Particularly, in the rocking curve measured about the single crystal substrate used in the present invention, locations of the main peak and the other peak are 0.05° to 2.0° different, more preferably 0.05° to 0.3° different from each other. On the contrary, although only one peak is observed in the rocking curve measured about a single-layer single crystal substrate (for a substrate poor in single-crystallinity, another peak may appear at a location 10° or more apart from the main peak), such XRD peaks are observed because of slight dethroughtion of the orientation at the bonded plane of the substrate of the present invention. In the rocking curve measured about the single-layer single crystal substrate, the dethroughtion of locations of the peaks are preferably less than or equal to 0.3°, and in spite of such a few degrees dethroughtion of orientation the piezoelectric film formed on the substrate of that kind has sufficiently good properties as well as can be uniform due to appropriately dispersed stress in the film resulting from the dethroughtion of the orientation even when being formed on a large area.

Thickness of the single crystal substrate used in the present invention is 0.05 mm to 2.5 mm, preferably 0.1 mm to 1.2 mm. Thickness of the substrate less than 0.05 mm is not preferable since it is difficult to maintain flatness and strength is deteriorated when the area of the substrate is large. In the case where the flatness may not be maintained, it becomes difficult to form a good piezoelectric film at the step of forming the piezoelectric film on the single crystal substrate. Further, thickness beyond 2.5 mm is not preferable since working efficiency is poor during removing the substrate at the step of making an actuator or an ink jet head.

Figure 2A:
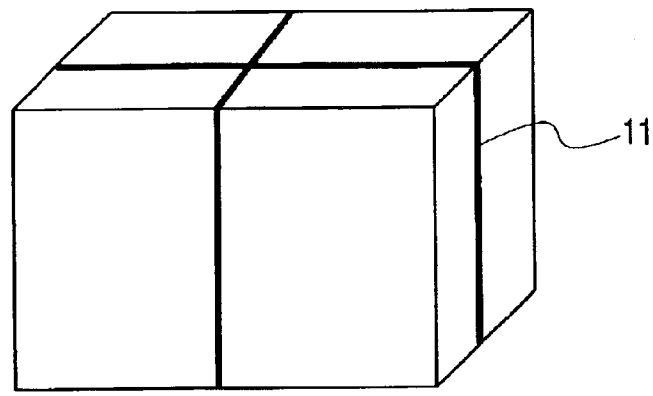
FIGS. 2A, 2B and 2C are schematic diagrams showing a formation process of a substrate of the present invention.
Figure 2B:
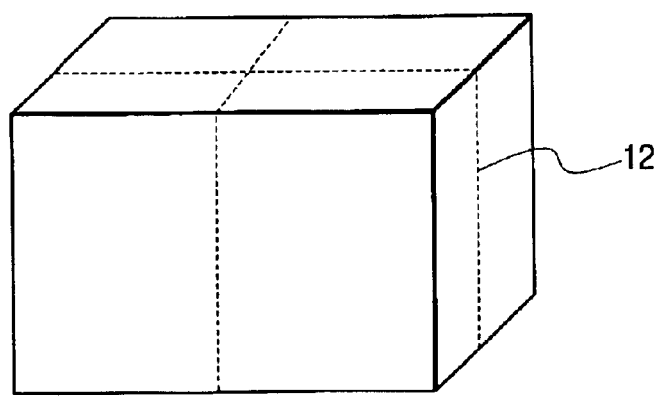
Figure 2C:
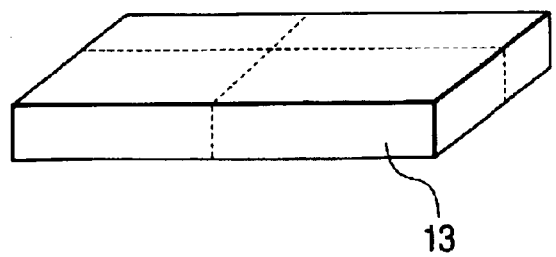

A manufacturing method of a substrate 1 used in the present invention will be illustrated. FIGS. 2A to 2C are schematic diagrams showing a formation process of the substrate. FIG. 2A shows an assembly in which 4 single crystal bulk bodies are piled up, and surfaces of the single crystals are polished at each contact plane 11. By high-temperature processing of the assembly under pressure, a bonded body is obtained, as shown in FIG. 2B. Reference numeral 12 represents a bonded portion. The bonded portion can be optically recognized. A large area single crystal substrate 13, used in the present invention and shown in FIG. 2C, having bonded portions can be obtained by cutting the single crystal body thus bonded.

In order to obtain a uniform device with excellent piezoelectric properties at the next step of making a device, the bonded portion 12 used is preferably 3 µm or less in width. More preferably it is 2.2 µm or less. The width of bonded portion can be measured by means of SEM observation. With regard to the bonded portion of a single crystal substrate, the existence of the bonded portion can be recognized with the naked eye or by a microscope because of difference in refractive index or lattice mismatching. The preferable Ra of the substrate is less than or equal to 15 nm, more preferably 10 nm or less when the surface roughness has been measured transversely across the bonded portion.

The measurement is performed, for example, by measuring along the length of 300 µm crossing the bonded portion by means of Tencor P-10 from KLA Tencor Co. at probe pressure of 5 mg, at scanning speed of 5 µm/sec, and at sampling frequency of 500 Hz. When the width of the bonded portion is larger than 3 µm or the Ra is larger than 15 nm, crystallinity of the piezoelectric film becomes poor and it turns difficult to yield devices good in uniformity in production of the devices.

At the next step, formed is a piezoelectric film on the surface of the bonded single crystal substrate. The piezoelectric film used in the present invention is a single-crystalline film or unidirectionally oriented polycrystalline film. The unidirectionally oriented polycrystalline film means such a film that intensity of a specific peak is 90% or higher, more preferably 95% or higher when being measured by XRD method (X-ray diffraction method). The crystal structure of the piezoelectric film is anyone of a tetragonal, a rhombohedral, or an orthorhombic crystal. The preferable orientation of the crystal is (001) or (111).

The method of forming the piezoelectric film includes a sintering method, spattering method, a MBE (molecular beam epitaxy) method, a MOCVD method, a sol-gel method, a gas deposition method, a hydrothermal process, etc. and the preferable one is a spattering method, a MBE method, a MOCVD method, a sol-gel method and a hydrothermal process. Thickness of the piezoelectric film is 0.8 µm to 50 µm, preferably 1.0 µm to 10 µm. The thickness less than 0.8 µm is poor in displacement strength not to generate force enough to displace the substrate 2. Further, the thickness larger than 50 µm is not preferable since the displacement cannot be enlarged or the drive voltage should be higher due to enlargement of rigidity of the piezoelectric film itself. A material of the piezoelectric film used includes lead zirconate titanate (PZT), lead lanthanum zirconate titanate (PLZT), lead magnesium niobate, lead magnesium niobium titanate, lead zinc niobate, lead zinc niobium titanate, etc. These materials can be added with a trace of dopant.

The patterning step in FIG. 1B is not essential, but a preferable embodiment for making a long ink jet head device, the device can be stably made even though thermal expansion coefficients of the piezoelectric film and the diaphragm structure member are different from each other. As the patterning method employed are wet etching, dry etching, resist lift-off, metal mask method, etc.

As a method of bonding the piezoelectric film 2 and the diaphragm structure member 3, direct bonding, diffusion bonding, an active metal method, and pressure bonding, etc. can be employed. The active metal method is preferably employed using metal such as In, Pd, Au, Cr, Ni, Cu, Sn, Mo, Ti, Zr, Ag, Pb. Temperature during the bonding is 80° C. to 500° C., more preferably 100° C. to 300° C. Further, pressure is 0.5 kg/mm$^2$ to 20 kg/mm$^2$, preferably 0.8 kg/mm$^2$ to 5 kg/mm$^2$. A layer, which is used as a bond layer in the active metal method can also be utilized as an electrode. Moreover, as a direct bonding method are there a method described in "Shingaku-giho; US95-24, EMD95-20, CPM95-32", etc.

The diaphragm structure member may be a workable substrate (including a multi-layered body) or may be a ready-made diaphragm, which has already been worked. The preferable diaphragm structure member is the former. A material used for the diaphragm structure member 3 includes metallic a material such as Si, SUS, Ni, Ti or a ceramic material such as zirconia, alumina, glass. Preferably, selected is a metallic material, more preferably a Si material. Particularly, a Si substrate with crystal orientation (110) is preferable. As the Si substrate, a SOI substrate, a SOS substrate, etc. can be used.

As a method of removing the substrate 1 are there a wet etching method and an exfoliation method. The wet etching method is a method where the substrate 1 is dissolved and removed with a liquid medium in which the substrate 1 can be dissolved. Preferably chosen is the exfoliation method where the substrate can be recycled. There are laser beam exfoliation, water jet method and mechanical exfoliation, and the laser beam exfoliation and the mechanical exfoliation are preferable. The laser beam exfoliation is a method where the piezoelectric film is peeled off from the single crystal utilizing thermal decomposition due to sudden temperature rise or difference in thermal expansion coefficient between the substrates by means of radiating a laser beam onto an interface of the piezoelectric film. The laser to be used includes an excimer laser, a YAG laser, He—Ne laser, a gas laser, a semiconductor laser, etc. The mechanical exfoliation is a method where the exfoliation is performed by means of physical and mechanical force and the substrate 1 is peeled off by applying mechanical stress between the substrate 1 and the piezoelectric film.

Figure 3A:
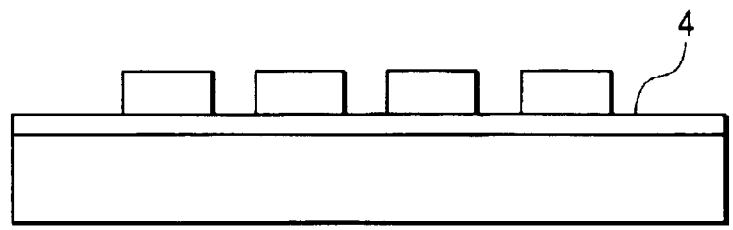
FIGS. 3A, 3B and 3C are schematic diagrams showing a formation process of an ink jet head of the present invention.
Figure 3B:
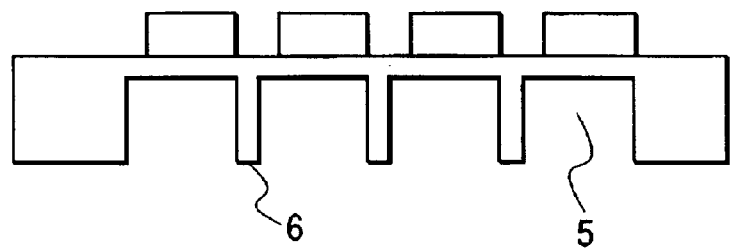
Figure 3C:
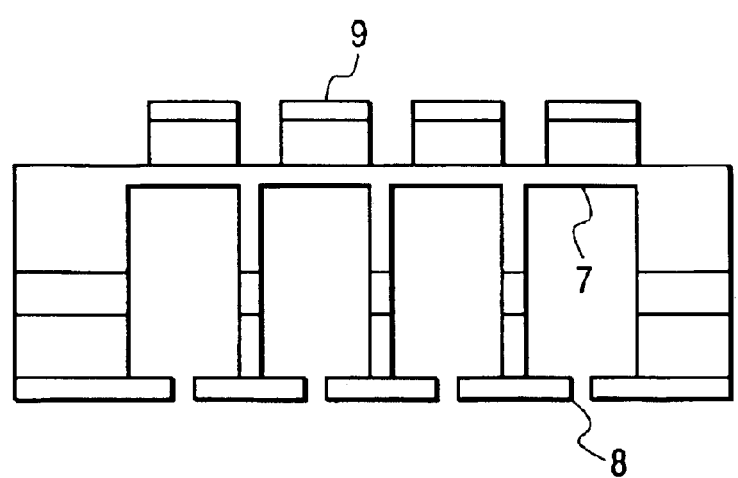

A manufacturing method of the present invention is such that a pressure chamber, an ink supply channel communicating with the pressure chamber, and a nozzle portion to be an ink discharge opening are formed in an actuator obtained by the similar method to the above. FIGS. 3A to 3C are schematic diagrams showing a formation process of an ink jet head. FIG. 3A is the actuator described in FIG. 1D in which an ink chamber 5 is formed (FIG. 3B). The reference numeral 6 refers to an ink chamber septum. As a method of forming the ink chamber, there are a method where the ink chamber is formed by etching a Si substrate, a method where a substrate in which a chamber has been formed is bonded, or a method where ink chamber septa 6 are first formed as a film and then processed, and anyone of the methods can be employed. The reference numeral 7 refers to a diaphragm of the ink jet head and a lower electrode not shown in the figure, and thickness is 0.5 to 15 µm, preferably 1 to 5 µm. In order to keep such a thin film remained uniformly through wet etching, a SOI substrate is preferably employed as the diaphragm structure member 3. Besides, the ink chamber can also be formed by means of a dry etching method. In FIG. 3C shown is an ink jet head in which an actuator provided with upper electrodes 9 and ink chambers is bonded to a member provided with nozzle portions 8. The member composing the nozzle portion can be either a single-layer substrate or a multilayer substrate.

Further, a manufacturing method of the present invention can be a method where forming a metallic film such as Cr, Ni on the piezoelectric film and the film is utilized as the electrode and the diaphragm. Thickness of the metallic diaphragm is preferably 0.5 to 2.0 times larger than that of the piezoelectric film. When such a method is employed, a member without any portions corresponding with the diaphragm can be employed as the diaphragm structure member.

As the ink jet head obtained in accordance with the present invention, a bender type head of unimorph-type can be stably yielded with ease, however, an ink jet head of bimorph-type can also be made by means of bonding the piezoelectric films on both sides of the diaphragm structure member 3 using the piezoelectric structure member as a shim.

In the following, the present invention will be explained giving some examples.

EXAMPLE 1

10 SrTiO$_3$ (100) single crystal cubic bulk bodies with a side of 10 mm were bonded and then cut to form a PZT (001) film of 2.5 µm by a spattering process on the manufactured STO (SrTiO$_3$) substrate with a dimension of 10 mm×100 mm (thickness 0.15 mm, width of a bonded portion 1.2 µm, a surface roughness through the bonded portion Ra=5 nm). The PZT film was a single crystal oriented in the orientation [001]. In a rocking curve measured about the bonded STO substrate by XRD measurement, a peak was recognized at the location 0.13°–0.16° dethroughted from that of the main peak. After forming a Ti layer (20 nm thick) on the PZT film on the STO substrate, a Au layer (200 nm thick) was formed to make a bond layer. These were etched to be as dense as 180 dpi. The size of one PZT element after etching was 88 µm in width, 2.8 mm in length, and 680 pieces of the PZT elements are arranged on the STO substrate.

Cr (30 nm) and Au (200 nm) was formed as a bond layer on a SOI substrate (Ra=0.02 µm) as a diaphragm structure member comprising a B doped Si layer of 3 µm, a SiO$_2$ layer of 0.5 µm, and Si (110) layer of about 400 µm in thickness. The Au layer on the PZT and the Au layer on the SOI substrate were faced to each other, and they were bonded by heating them under a reduced pressure of 10$^{-3}$ Pa and a pressure of 0.3 kgf/mm², at 150° C., for 1 hour. The PZT film was bonded with good adhesion on the Au layer on the SOI substrate. By radiating an excimer laser beam (KrF) on that from the STO substrate side at the exposure of about 350 mJ/cm², the STO substrate and the PZT were peeled off, and patterned PZT bodies could be transferred onto the SOI substrate. When Pr of the piezoelectric film after bonding was measured by applying an upper electrode with Au paste, a good property of about 40 μC/cm² was obtained.

By wet etching the Si substrate from the side opposite to the piezoelectric film using $SiO_2$ layer as an etching-stop layer, an ink chamber of 100 μm in width, 2 mm in length was formed at each lower portion of the piezoelectric film to obtain an actuator according to the present invention. By putting a Si substrate on which nozzles of 25 μm Φ were opened and 2 SUS substrate on which ink flow channels were formed on the actuator, and they were stuck together in order for the nozzle portion to come down to the end portion of the ink chamber to yield an ink jet head. When discharging liquid form the head at 5 kHz, a liquid droplet of about 20 pl could be discharged at the speed of 15 m/s.

EXAMPLE 2

A patterned body of a piezoelectric film was manufactured in the same manner except that the thickness of the piezoelectric film was chosen as 4 μm, and the piezoelectric films were bonded on both sides of 20 μm thick Ti substrate at the same time. Then, an actuator of bimorph type was obtained by exfoliating an STO substrate. By measuring an amount of displacement with a laser displacement meter by the same method as in Example 1 in the condition where the same voltage was applied to the piezoelectric films on both sides using the Ti substrate as an electrode, the displacement of 1.25 μm at 1 kHz, and of 0.45 μm at 10 kHz was measured. Further, variations between every element were small and excellent properties were shown.

EXAMPLE 3

Figure 4:
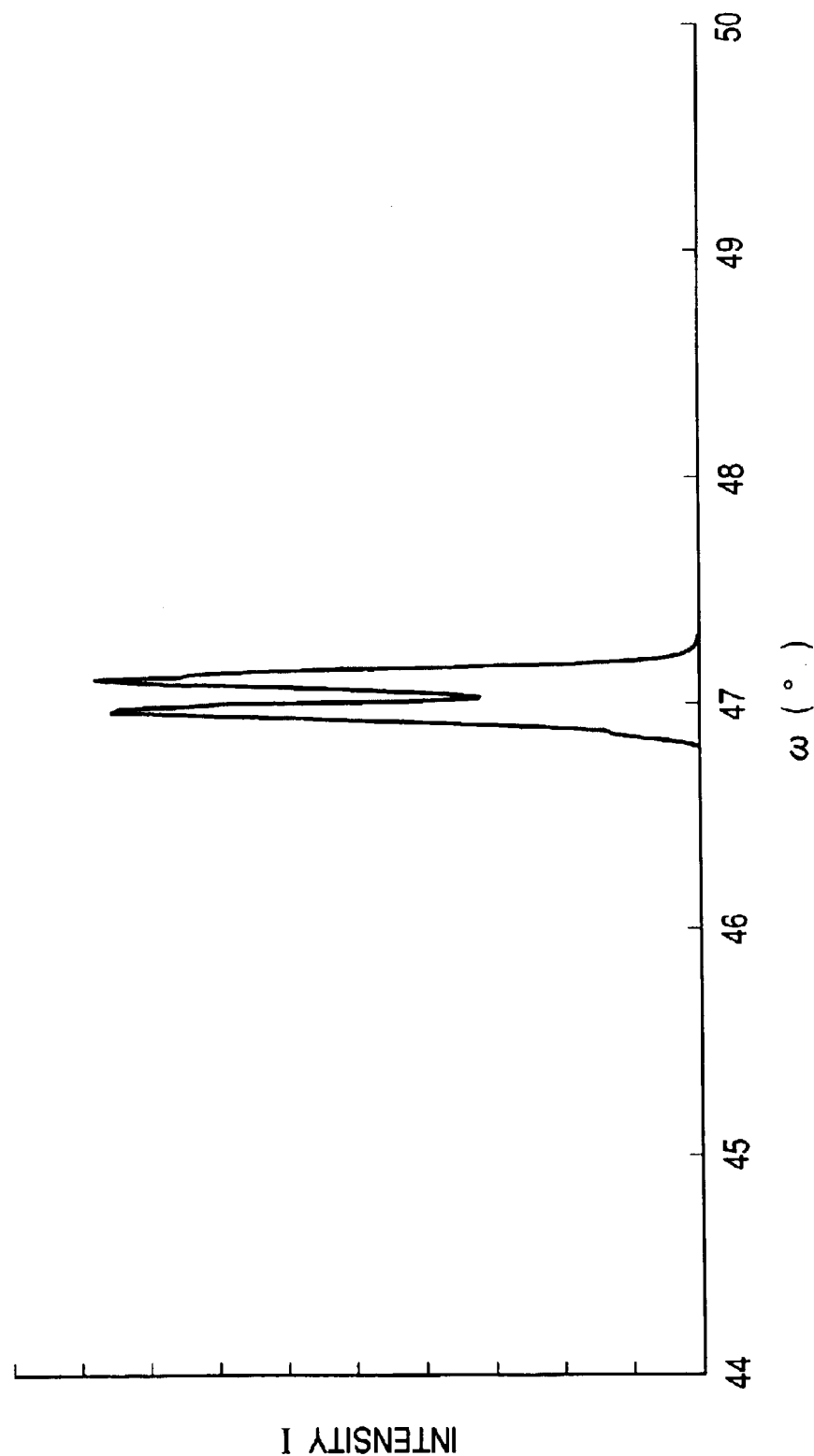
FIG. 4 is a graph showing that a dethroughtion of orientations of an MgO substrate is confirmed by observing 2 peaks of (400) different by 0.13° from each other in rocking curve measurement.

After forming $PbTiO_3$ on the bonded MgO substrate (thickness 0.5 mm, width of bonded portion 400 nm or less), a PZT single crystal film was formed thereon. The dethroughtion of orientation of the MgO substrate used in this example was determined by observing two peaks 0.13° apart from each other at the location of the peak of (400) in the rocking curve measured (see FIG. 4). The PZT film on the substrate comprised a 98% or more unidirectionally oriented film according to the ratio of the peak intensities in XRD measurement (θ–2θ measurement). Manufacturing an actuator in the same manner as Example 1 except that $PbTiO_3$ was removed by etching, the actuator with similar good properties was obtained.

When forming a piezoelectric film in the same manner on a substrate with 0.31° dethroughtion of the orientation in the rocking curve measurement, the PZT film was composed of a 90% unidirectionally oriented film, and the property of an actuator manufactured was poor a little in an amount of displacement, but the displacement was still practical.

EXAMPLE 4

Using an STO substrate with Ra of 16 nm or more, an ink jet head was manufactured in the same manner as Example 1. As a result of the similar evaluation to Example 1, variations of discharge amount between nozzles were a little large, but excellent performance in liquid discharge was confirmed.

COMPARISON 1

An ink jet head with the same specifications as those in Example 1 was processed using 10 STO substrates having a side of 10 mm. Although making a devise was tried forming PZT (001) single crystal film of 2.5 μm in thickness on each substrate by spattering, the head could not be formed at the joint portions between each substrate, and the head with nozzles uniformly arranged in rows and columns at 180 dpi was not obtained. Further, since thickness of a piezoelectric film on each substrate was a little different from each other, ink discharge performance varied at the location of each substrate, and the device resulted in one difficult to control because of different drop volume and drop discharge speed.

What is claimed is:

1. A method of manufacturing an actuator comprising the steps of:
   bonding a piezoelectric film formed on a single crystal substrate to a diaphragm structure member; and
   removing the single crystal substrate therefrom to manufacture the actuator;
   wherein the single crystal substrate is a substrate having bonded portions where a plurality of single crystal substrates are bonded together.

2. The method of manufacturing the actuator according to claim 1, wherein the single crystal substrate having width of the bonded portions less than or equal to 3 μm is employed.

3. The method of manufacturing the actuator according to claim 1, wherein a surface roughness Ra of the single crystal substrate measured through the bonded portions is less than or equal to 15 nm.

4. The method of manufacturing the actuator according to claim 1, wherein the single crystal substrate has 2 peaks of a rocking curve measured in XRD (X-ray diffraction) measurement, locations of the peaks being spaced 0.05° to 2.0° apart from each other.

5. The method of manufacturing the actuator according to claim 4, wherein the single crystal substrate has 2 peaks of the rocking curve measured in XRD (X-ray diffraction) measurement, the locations of the peaks being spaced 0.05° to 0.3° apart from each other.

6. The method of manufacturing the actuator according to claim 1, wherein the single crystal substrate is one of an MgO substrate, an STO substrate, a $BaTiO_3$ substrate, and a $ZrO_2$ substrate which may be doped with Y or a rare earth element.

7. The method of manufacturing the actuator according to claim 1, wherein thickness of the single crystal substrate is in a range of 0.05 mm to 2.5 mm.

* * * * *